United States Patent
Lin et al.

(10) Patent No.: US 6,171,904 B1
(45) Date of Patent: Jan. 9, 2001

(54) METHOD FOR FORMING RUGGED POLYSILICON CAPACITOR

(75) Inventors: Ping-Wei Lin, Chai-I; Jui-Ping Li, San-Hsing Hsiang; Ming-Kuan Kao, Hsin-Chu, all of (TW)

(73) Assignee: Mosel Vitelic Inc., Hsin-Chu (TW)

( * ) Notice: Under 35 U.S.C. 154(b), the term of this patent shall be extended for 0 days.

(21) Appl. No.: 09/352,411

(22) Filed: Jul. 14, 1999

(51) Int. Cl.[7] ............... H01L 21/8242; H01L 21/8244; H01L 21/20; H01L 21/425
(52) U.S. Cl. ............... 438/255; 438/238; 438/253; 438/239; 438/396; 438/398; 438/528; 438/964
(58) Field of Search ................... 438/964, 398, 438/396, 528, 253, 238, 239, 255

(56) References Cited

U.S. PATENT DOCUMENTS

| | | | |
|---|---|---|---|
| 5,856,007 | * 1/1999 | Sharan et al. | 438/398 |
| 5,937,307 | * 8/1999 | Jeng et al. | 438/398 |
| 5,937,314 | * 1/1999 | Ping et al. | 438/486 |

* cited by examiner

Primary Examiner—John F. Niebling
Assistant Examiner—Jennifer M. Kennedy
(74) Attorney, Agent, or Firm—Bacon & Thomas

(57) ABSTRACT

The present invention relates to a method for forming rugged polysilicon capacitance electrodes uses for dynamic random access memory processes is disclosed. The method is capable in reducing process time, enhancing yield, and saving production cost. Wherein, the process of the present invention comprises: firstly, a semiconductor wafer is delivered into a low pressure chemical vapor deposition (LPCVD) tube. Herein, a non-doped or doped amorphous silicon layer is deposited on the surface top of electrodes. A rugged polysilicon capacitance is formed on top of the non-doped or doped amorphous silicon layer by using the methods of rising temperature and decreasing pressure. Then, an ion implantation is applied and follows by a wafer cleaning procedure and an annealing process, wherein those procedures are accomplished after the removal of the wafer from LPCVD tube. During the annealing process, the non-doped or doped amorphous silicon layer is transformed into a polysilicon layer under a temperature roughly about 850.degree.C. In particularly, an in-situ phosphorous doped amorphous silicon can be deposited prior to the formation of non-doped amorphous silicon layer, and won't influence the stages that follow.

29 Claims, 7 Drawing Sheets

METHOD FOR FORMING RUGGED POLYSILICON CAPACITOR

BACKGROUND OF THE INVENTION

1. Field of the Invention

The present invention relates to a method for forming rugged polysilicon capacitance electrodes, that is use in dynamic random access memory processes. And more particularly, the present invention relates to a method for forming rugged polysilicon capacitance electrodes that eventually reduces process time, enhances yield, and saves production costs.

2. Description of the Prior Art

Recently, demand for dynamic random access memory (DRAM) has rapidly increased owing to widespread use of electronic equipment. In particular, it is applied relatively information industry in the computer hardware. In addition to applied information industry, large-scale integration (LSI), very large scale integration (VLSI), and ultra large-scale integration (ULSI) must use greatly dynamic random access memory. In next century, the fabricated technology of the dynamic random access memory (DRAM) is still performed a primary role. Due to electronic, information, and communication product intent to light, thin, short, and quick, which high density and large capacity of the dynamic random access memory with demand is increased.

Figure 1:
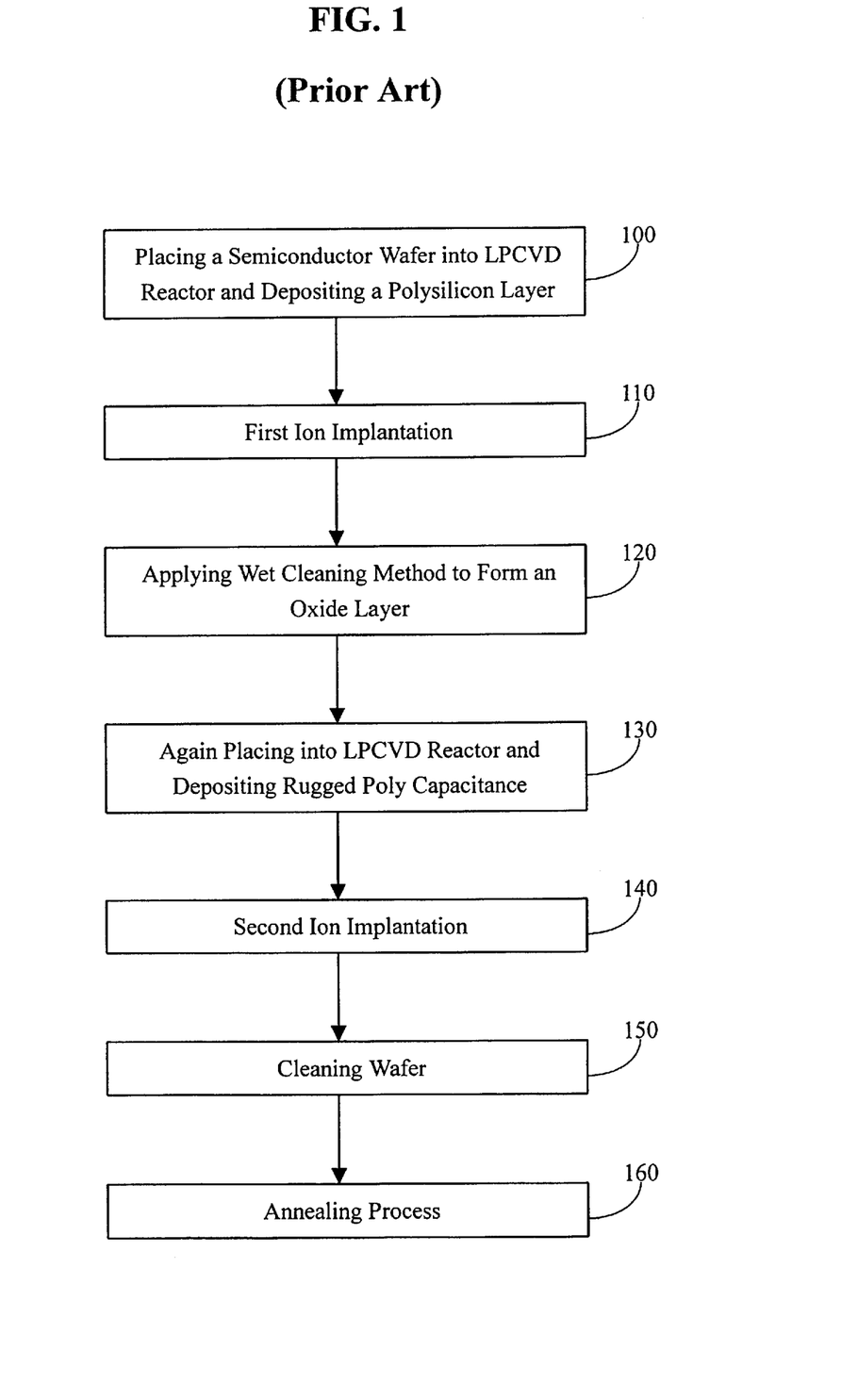
FIG. 1 is a flowchart showing a conventional method for forming rugged polysilicon capacitance electrode.

In dynamic random access memory fabrication, high density and large capacity of the dynamic random access memory is fabricated rugged polysilicon method. This is used hemispherical surface more large surface area than plane, by using increased the capacitor of the dynamic random access memory. FIG. 1 shows stage 100 placing a semiconductor wafer into low-pressure chemical vapor deposition (LPCVD) reactor and depositing a polysilicon layer. Stage 110 shows first ion implantation in a semiconductor wafer. However, stage 120 uses 1% dilute HF, by using wet etching forming a thin chemical oxide of polysilicon surface. Moreover, stage 130 places a chip into low-pressure chemical vapor deposition (LPCVD) reactor, by using the rugged polysilicon layer to form the rugged polysilicon capacitor. Stage 140 shows second ion implantation in semiconductor wafer. Stage 150 uses wet cleaning for the second time to clean wafer. Finally, stage 160 performs an annealing process at 850° C. temperature. The entire process takes about 1 to 2 days, hence not only wasting time and also resulting in yield reduction due to particle contamination on wafer surface during ion implantation and wafer cleaning outside LPCVD tube.

SUMMARY OF THE INVENTION

In accordance with the present invention, a method is provided for forming rugged polysilicon capacitance electrodes that substantially solves the drawbacks of the conventional way for forming rugged polysilicon capacitance electrodes.

In one objective of the present invention, a method for forming rugged polysilicon capacitance electrodes is provided to reduce the process time. Since the present invention is accomplished within a single LPCVD tube to form the entire structure of rugged polysilicon capacitance electrode, the time required is only 4 to 5 hours. In comparing with 1 to 2 days for the conventional method, a saving of 60 to 80 percent of process time can be achieved. Therefore, an advantage of process time reduction is provided potentially.

Another objective of the present invention, a method for forming rugged polysilicon capacitance electrodes is provided to enhance yield. Since the present invention is accomplished within a single LPCVD tube to form the entire structure of rugged polysilicon capacitance electrode, and unlike the conventional method must enter and exist LPCVD tube for two times. Therefore, an increment of particles adhering to wafers due to the shifting of working areas can be greatly reduced. Hence, results in contamination-free wafers and an enhancement in yield.

A further objective of the present invention, a method for forming rugged polysilicon capacitance electrodes is provided to save production costs. Since the present invention is accomplished within a single LPCVD tube to form the entire structure of rugged polysilicon capacitance electrode, only one ion implantation and one cleaning process are needed. Unlike the conventional method, two sets of ion implantation and cleaning process are required. Therefore, the present invention is accompanied by the advantage of both the reductions in process flow and in production costs.

In accordance with the above objectives, a rapid process for forming rugged polysilicon capacitance electrodes is provided. First of all, a semiconductor wafer is delivered into a LPCVD tube. Herein, a non-doped or doped amorphous silicon layer is deposited on the surface top of electrodes. A rugged polysilicon capacitance is formed on top of the non-doped or doped amorphous silicon layer by using the methods of rising temperature and decreasing pressure. Then, an ion implantation is applied and follows by a wafer cleaning procedure and an annealing process, wherein those procedures are accomplished after the removal of the wafer from LPCVD tube. During the annealing process, the non-doped or doped amorphous silicon layer is transformed into a polysilicon layer under a temperature roughly about 850° C. In particularly, an in-situ phosphorous doped amorphous silicon can be deposited prior to the formation of non-doped amorphous silicon layer, and won't influence the stages that follow.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2:
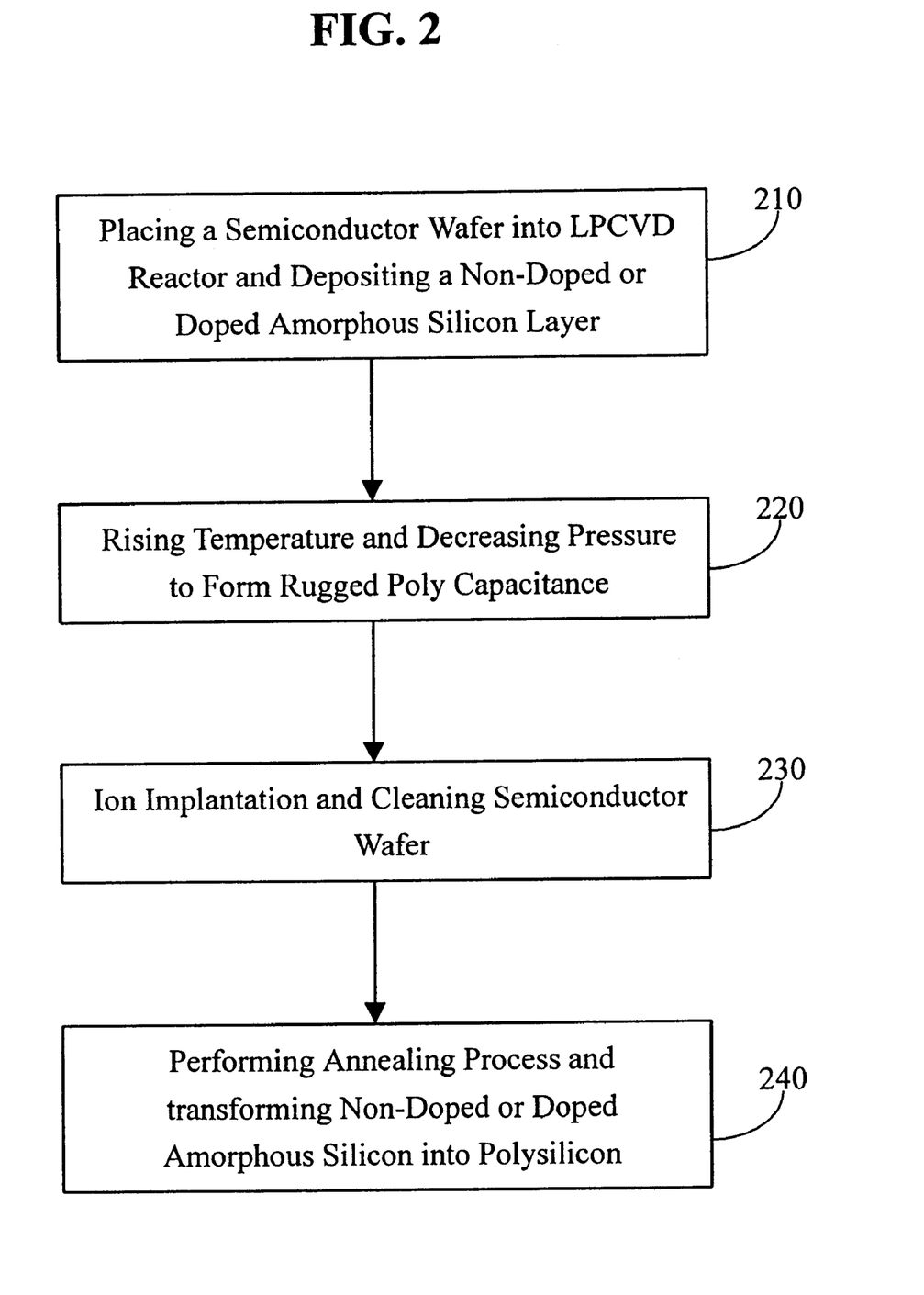
FIG. 2 is a flowchart of a first embodiment of the present invention for forming rugged polysilicon capacitance electrode.

FIG. 2 shows the method for forming a rugged polysilicon capacitance electrode, which also represents a flowchart showing the key elements of the first embodiment of the present invention. First of all, stage 210 provides a semiconductor wafer and then sends the wafer into a low-pressure chemical vapor deposition (LPCVD) tube. Herein, a non-doped or doped amorphous silicon layer is deposited on the surface top of electrodes. In stage 220, a rugged polysilicon capacitance is formed on top of the non-doped or doped amorphous silicon layer by using the methods of rising temperature and decreasing pressure. Then, stage 230 applies an ion implantation to implant dopant and follows by a wafer cleaning procedure, wherein those two procedures are done after the removal of the wafer from LPCVD tube. The last step is stage 240, that is an annealing process. The non-doped or doped amorphous silicon layer has been transformed into a polysilicon layer under a temperature roughly about 850° C. The required conditions at different stages mentioned in FIG. 2 are depicted in more details in FIGS. 3 and 4.

Figure 3A:
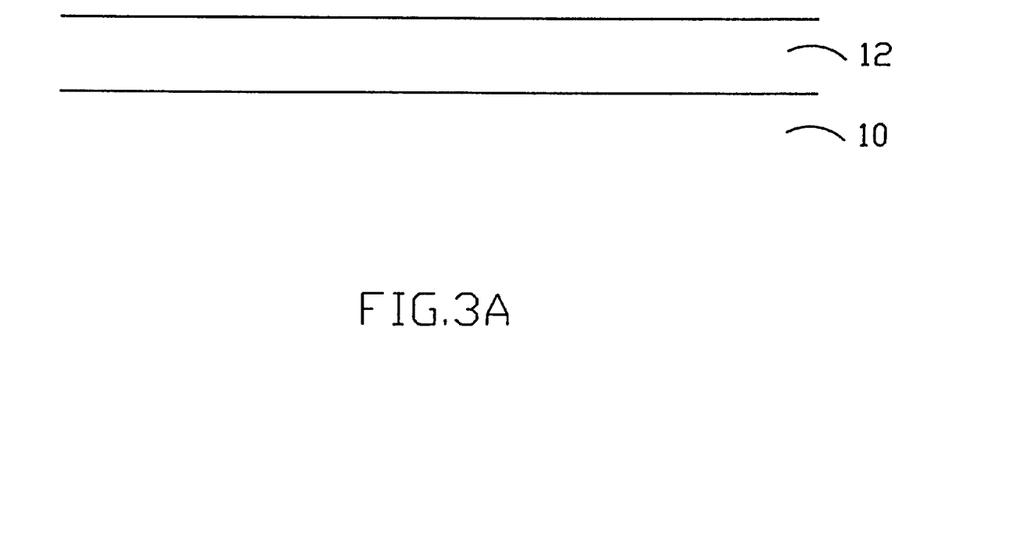
FIG. 3A to FIG. 3B depicts the process flow of the first embodiment according to the present invention in cross-sectional views.

In FIG. 3, firstly, a semiconductor wafer 10 places inside a LPCVD tube and starts to inject a first gas into the tube after the wafer has been heated a temperature in between about 0.5 and 1° C. and a pressure in between about 510 and 540 torr are reached. The gas been injected can be silane, silicoethane, or any other matters that are capable in forming amorphous silicon. This injected gas is maintained at a constant temperature and a constant pressure for a period not less than 25 minutes, hence, a non-doped amorphous silicon layer 12 having a thickness in between about 300 and 1000 angstroms is formed on top of electrodes' surfaces of the semiconductor wafer 10. There are two things need to be mentioned briefly: (1) the shape of electrode is not restricted, it can be a strip, a rod, a cylinder, or any other planar or three-dimensional structures. (2) There are device structures formed on the semiconductor wafer 10. Nevertheless, these are not that important for the present invention, even if they are, the present invention won't be affected at all.

Figure 3B:
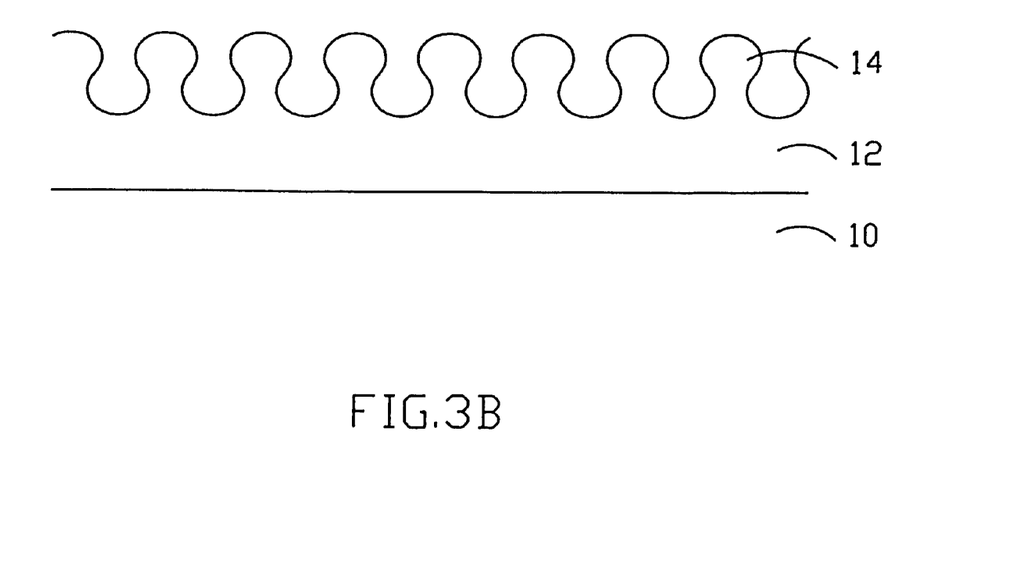
Figure 4:
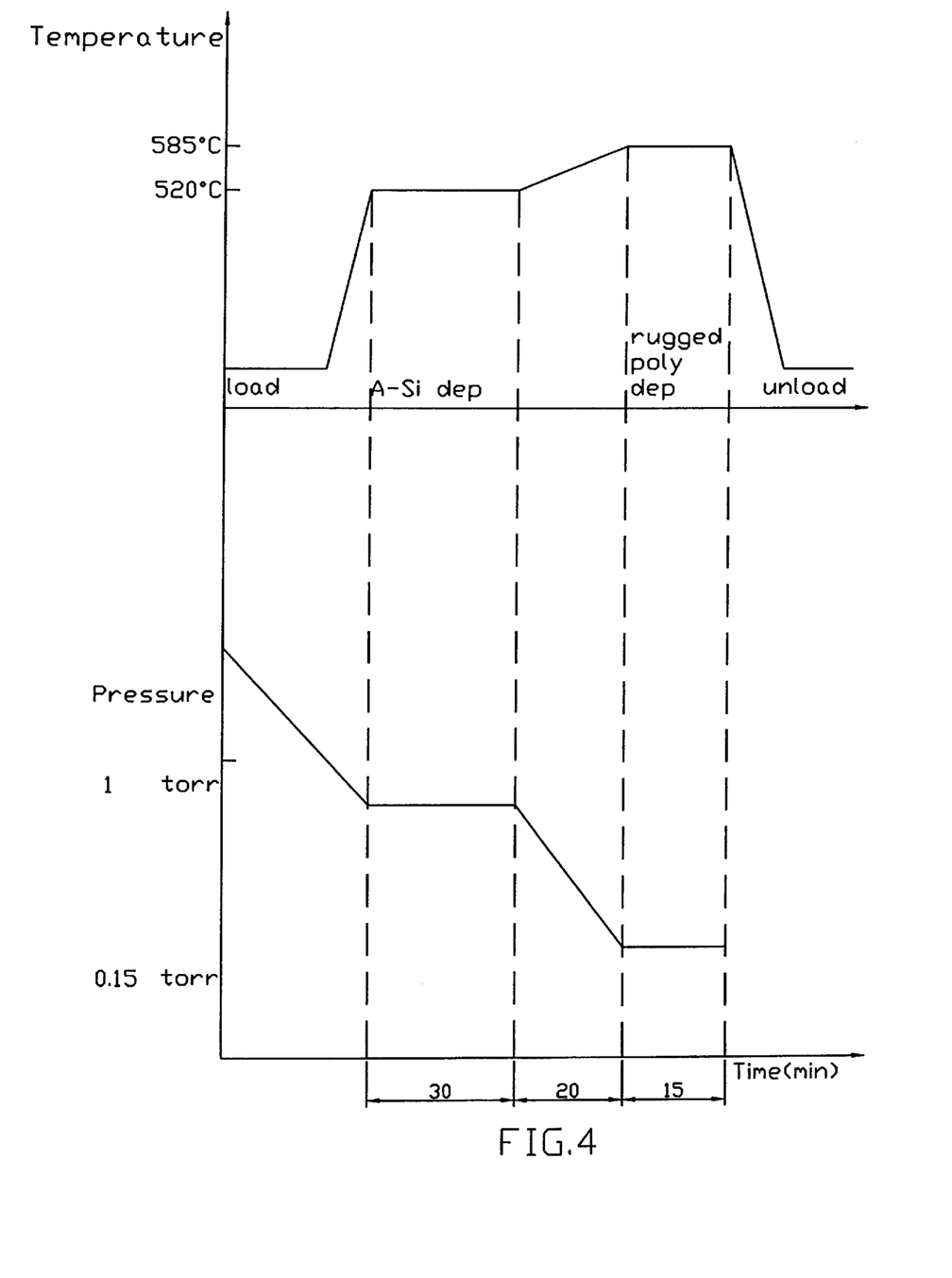
FIG. 4 shows the graphs of heating temperature and injecting gas pressure against time for the first embodiment of the present invention within a CVD reactor.

Next, the injection of the first gas ceases and starts to rise temperature and decrease pressure for about 30 minutes. The first gas is injected again once the temperature reaches in between about 580 and 590° C. and the pressure is in between about 0.1 and 0.2 torr. In accordance with the method of rising temperature and decreasing pressure to form a rugged polysilicon capacitance 14 over the non-doped amorphous silicon layer 12, as what is shown in FIG. 3B. The formation of this rugged polysilicon capacitance got to be done under constant temperature and pressure for a period not less than 10 minutes. FIG. 4 shows the graphs of heating temperature and injecting gas pressure against time for the first embodiment of the present invention within a CVD reactor.

The semiconductor wafer is then removed from LPCVD tube after the tube has been cool off, then an ion implantation process is performed to implant doping ions like phosphorous or arsenic for the purpose of sheet resistivity reduction. Particles adhered to the surfaces of semiconductor wafers 10 and rugged polysilicon capacitance 14 during the ion implantation are removed by applying wet cleaning method. At the same time, an annealing process is performed to transform the non-doped amorphous silicon layer into a polysilicon layer under a temperature in between about 800 and 850° C.

Figure 5:
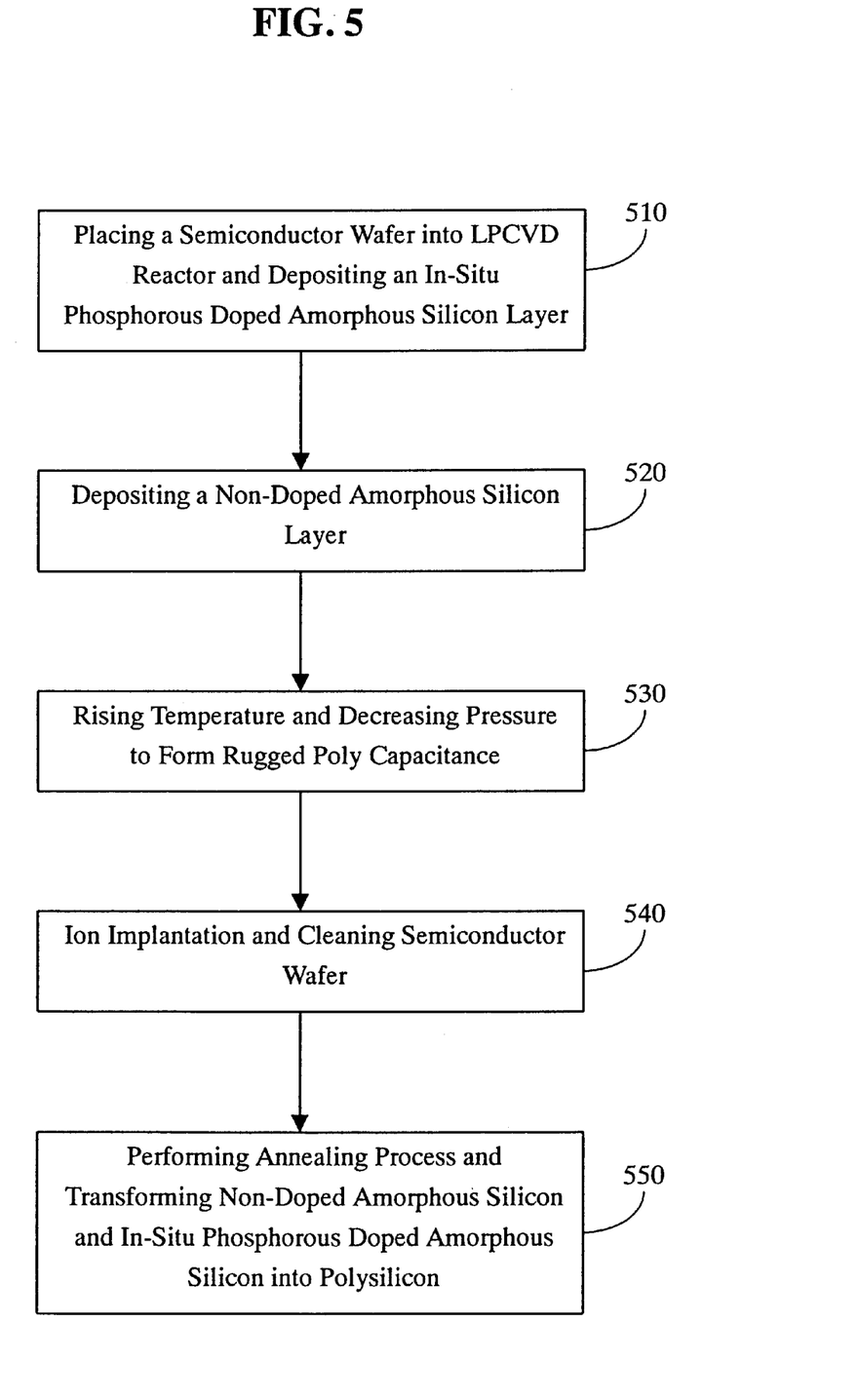
FIG. 5 is a flowchart of a second embodiment of the present invention for forming rugged polysilicon capacitance electrode.

In particularly, in-situ phosphorous doped amorphous silicon can be deposited prior to the formation of non-doped amorphous silicon layer. A second embodiment of the present invention is therefore enclosed. Referring to FIG. 5, firstly, stage 510 provides a semiconductor wafer and then sends the wafer into a low-pressure chemical vapor deposition (LPCVD) tube. Herein, the in-situ phosphorous doped amorphous silicon layer is deposited on the surface top of electrodes. Stage 520 deposits a non-doped amorphous silicon layer on top of the in-situ phosphorous doped amorphous silicon layer. In stage 530, a rugged polysilicon capacitance is formed on top of the non-doped amorphous silicon layer by using the methods of rising temperature and decreasing pressure. Then, stage 540 applies an ion implantation to implant dopant and follows by a wafer cleaning procedure, wherein those two procedures are done after the removal of the wafer from LPCVD tube. The last step is stage 550, that is an annealing process. The non-doped amorphous silicon layer and the in-situ phosphorous doped amorphous silicon layer are transformed into a polysilicon layer under a temperature roughly about 850° C. The required conditions at different stages mentioned in FIG. 5 are depicted in more details in FIGS. 6 and 7.

Figure 6A:
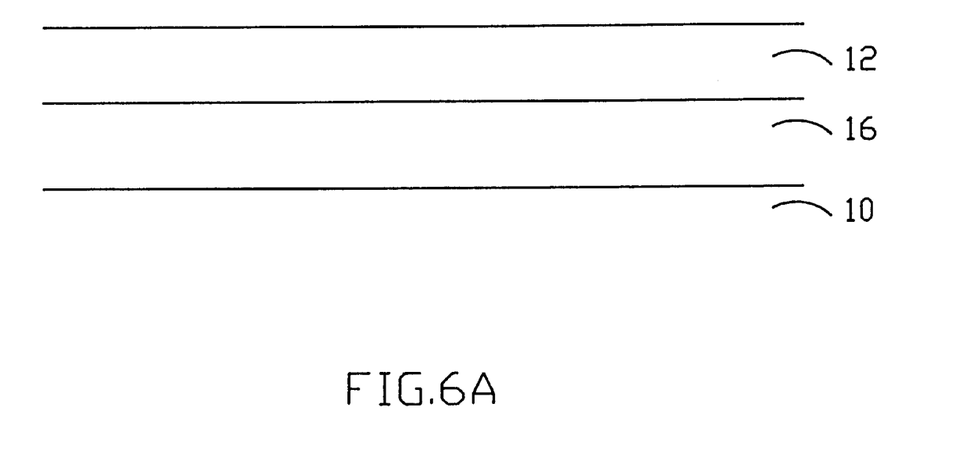
FIG. 6A to FIG. 6B depicts the process flow of the second embodiment according to the present invention in cross-sectional views.

In FIG. 6A, firstly, a semiconductor wafer 10 places inside a LPCVD tube and starts to inject two gases (a first gas and a second gas) into the tube after the wafer has been heated until a temperature in between about 510 and 540° C. and a pressure in between about 0.25 and 1 torr are reached. The first gas been injected can be silane, silicoethane, or any other matters that are capable in forming amorphous silicon. The second gas is a matter having either boron or phosphorous dopant, such as boron hydride or phosphorous hydride. Those two injected gases are maintained at a constant temperature and a constant pressure for a period not less than 25 minutes, hence, an in-situ phosphorous doped amorphous silicon layer 16 having a thickness in between about 300 and 1000 angstroms is formed on top of electrodes' surfaces of the semiconductor wafer 10.

Figure 6B:
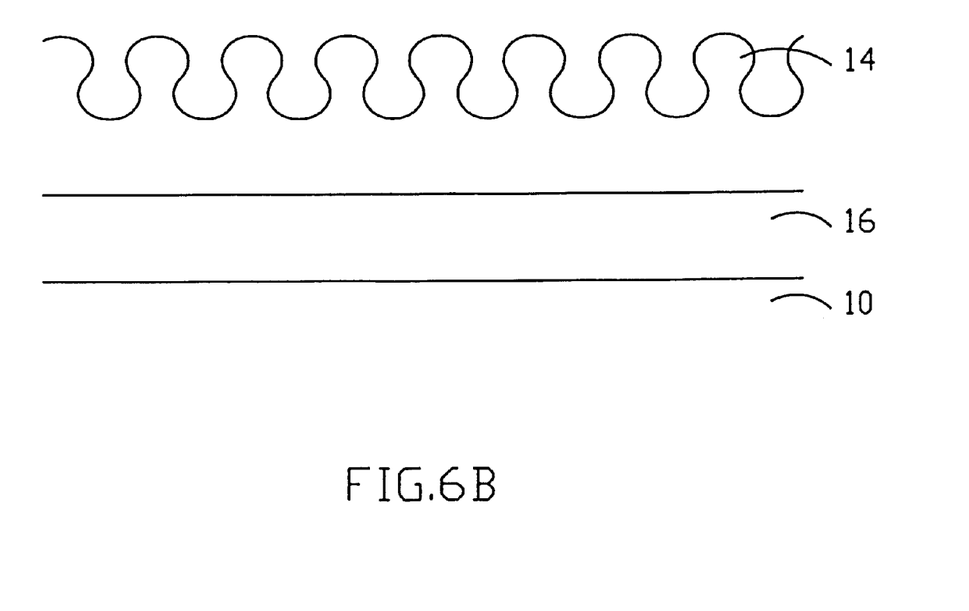
Figure 7:
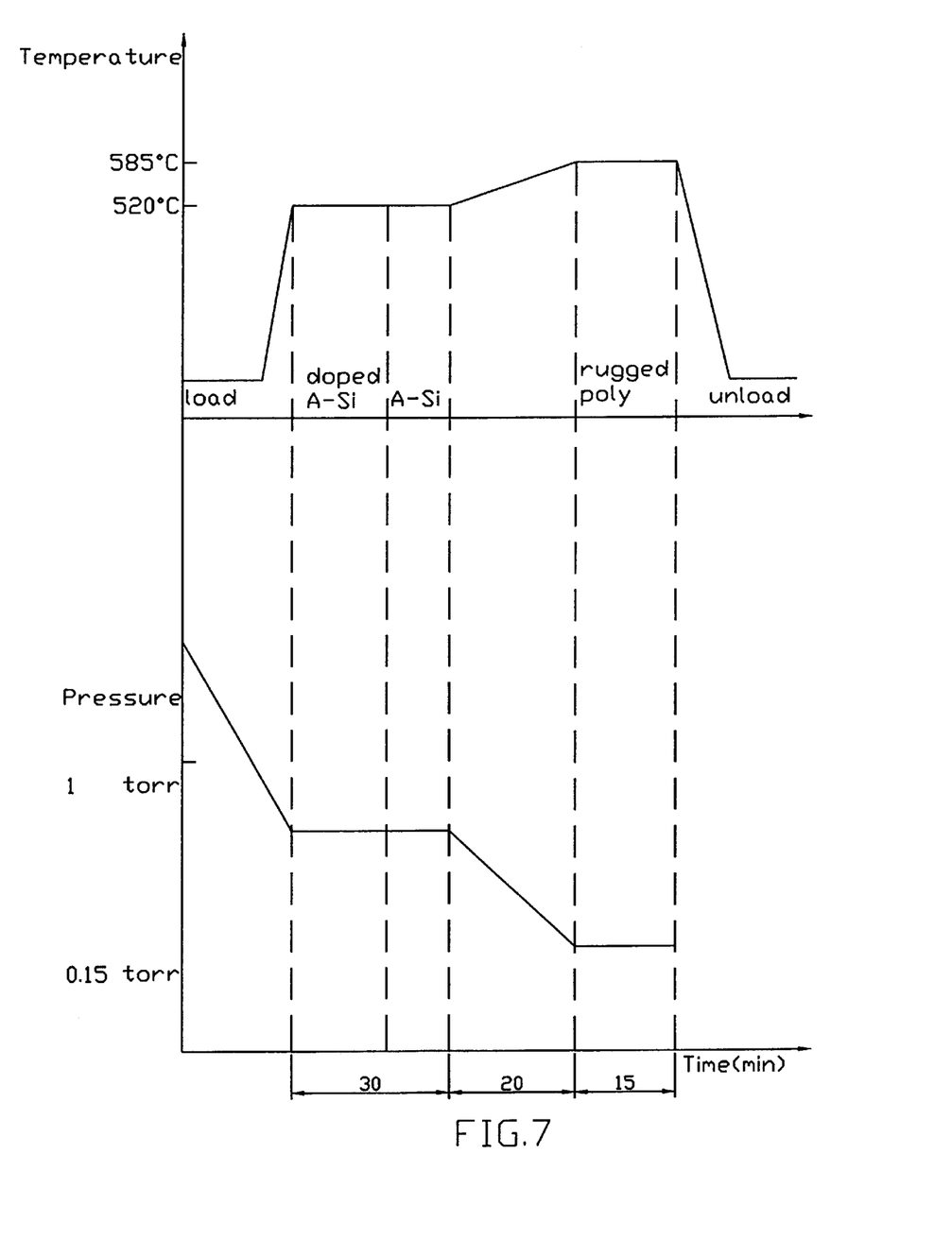
FIG. 7 shows the graphs of heating temperature and injecting gas pressure against time for the second embodiment of the present invention within a CVD reactor.

Consequentially, the second gas injection ceases and still keeping the first gas injection to deposit a non-doped amorphous silicon layer 12 over the surface of the in-situ phosphorous doped amorphous silicon layer 16 to a thickness in between about 100 and 300 angstroms. At this stage, the temperature and the pressure with the tube are remain unchanged for a period not less than 10 minutes, as what is shown in FIG. 6B. Next, the injection of the first gas ceases and starts to rise temperature and decrease pressure for about 30 minutes. The first gas is injected again once the temperature reaches in between about 580 and 590° C. and the pressure is in between about 0.1 and 0.2 torr. In accordance with the method of rising temperature and decreasing pressure to form a rugged polysilicon capacitance 14 over the non-doped amorphous silicon layer 12, as what is shown in FIG. 6C. The information of this rugged polysilicon capacitance got to be done under constant temperature and pressure for a period not less than 10 minutes. FIG. 7 shows the graphs of heating temperature and injecting gas pressure against time for the second embodiment of the present invention within a CVD reactor.

The semiconductor wafer is then removed from LPCVD tube after the tube has been cool off, then an ion implantation process is performed to implant doping ions like phosphorous or arsenic for the purpose of sheet resistivity reduction. Particles adhered to the surfaces of semiconductor wafers and rugged polysilicon capacitance 14 during the ion implantation are removed by applying wet cleaning method. At the same time, an annealing process is performed to transform both the non-doped amorphous silicon layer and the in-situ phosphorous doped amorphous silicon layer 16 into a polysilicon layer under a temperature in between about 800 and 850° C.

Although specific embodiments have been illustrated and described, it will be obvious to those skilled in the art that various modifications may be made without departing from what is intended to be limited solely by the appended claims.

What is claimed is:

1. A method for forming rugged capacitance electrode comprising:

sending a semiconductor wafer into a reaction chamber;

adjusting said reaction chamber to a first temperature;

injecting a first gas into said reaction chamber to a first pressure;

forming a non-doped or doped amorphous silicon layer on the top surface of said semiconductor wafer within said reaction chamber;

ceasing injecting said first gas into said reaction chamber;

adjusting said reaction chamber to a second temperature higher than the first temperature;

injecting said first gas into said reaction chamber at a second pressure less than the first pressure;

forming a rugged polysilicon layer on said non-doped or doped amorphous silicon layer in said reaction chamber, and at the second temperature and the second pressure;

forming a doping region inside said rugged polysilicon layer, as well as inside said non-doped or doped amorphous silicon layer;

cleaning said semiconductor wafer; and performing an annealing process to transform said non-doped or doped amorphous silicon layer into a polysilicon layer.

2. The method in accordance with claim 1, wherein said reaction chamber comprises a chemical vapors deposition reactor.

3. The method in accordance with claim 1, wherein said first temperature is in between about 510 and 540° C.

4. The method in accordance with claim 3, wherein said first temperature is lasting for not less than 30 minutes.

5. The method in accordance with claim 1, wherein said first gas comprises one of the following: silane, silicoethane.

6. The method in accordance with claim 1, wherein said first pressure is ranging from about 0.5 to 1 torr.

7. The method in accordance with claim 1, wherein said first gas maintains at said first pressure for a time not less than 30 minutes.

8. The method in accordance with claim 1, wherein said non-doped or doped amorphous silicon layer has a thickness ranging from about 300 to 1000 angstroms.

9. The method in accordance with claim 1, wherein said second temperature is in between about 580 and 590° C.

10. The method in accordance with claim 9, wherein said second temperature is lasting for not less than 10 minutes.

11. The method in accordance with claim 1, wherein said second pressure is ranging from about 0.1 to 0.2 torr.

12. The method in accordance with claim 1, wherein said first gas maintains at said second pressure for a time not less than 10 minutes.

13. The method in accordance with claim 1, wherein said annealing process is accomplished at a temperature in between about 800 and 850° C.

14. A method for forming rugged capacitance electrode comprising:

sending a semiconductor wafer into a reaction chamber;

adjusting said reaction chamber to a first temperature;

injecting a first gas and a second gas at the same time into said reaction chamber to a first pressure;

forming an in-situ phosphorus doped amorphous silicon layer on the top surface of said semiconductor wafer within said reaction chamber;

ceasing injecting said second gas into said reaction chamber;

adjusting said first gas to said first pressure within said reaction chamber;

forming a non-doped amorphous silicon layer on the surface of said in-situ phosphorus doped amorphous silicon layer;

ceasing injecting said first gas into said reaction chamber;

adjusting said reaction chamber to a second temperature higher than the first temperature;

injecting said first gas into said reaction chamber at a second pressure less than the first pressure;

forming a rugged polysilicon layer on said non-doped amorphous silicon layer in said reaction chamber, and at the second temperature and the second pressure;

forming a doping region inside said rugged polysilicon layer, as well as inside said non-doped or doped amorphous silicon layer;

cleaning said semiconductor wafer; and performing an annealing process to transfer said non-doped amorphous silicon layer and said in-situ phosphorus doped amorphous silicon layer into a polysilicon layer.

15. The method in accordance with claim 14, wherein said reaction chamber comprises a low-pressure chemical vapors deposition reactor.

16. The method in accordance with claim 14, wherein said first temperature is in between about 510 and 540° C.

17. The method in accordance with claim 16, wherein said first temperature is lasting for not less than 30 minutes.

18. The method in accordance with claim 14, wherein said first gas comprises one of the following: silane, silicoethane.

19. The method in accordance with claim 14, wherein said second gas comprises one of the following: boron hydride, phosphorus hydride.

20. The method in accordance with claim 14, wherein said first pressure is ranging from about 0.25 to 1 torr.

21. The method in accordance with claim 14, wherein said first gas and said second gas maintain at said first pressure together for a time not less than 30 minutes.

22. The method in accordance with claim 14, wherein said in-situ phosphorous doped amorphous silicon layer has a thickness ranging from about 300 to 1000 angstroms.

23. The method in accordance with claim 14, wherein said first gas maintains at said first pressure alone for a time not less than 30 minutes.

24. The method in accordance with claim 14, wherein said non-doped amorphous silicon layer has a thickness ranging from about 100 angstroms to about 300 angstroms.

25. The method in accordance with claim 14, wherein said second temperature is in between about 580 and 590° C.

26. The method in accordance with claim 14, wherein said second temperature is lasting for not less than 10 minutes.

27. The method in accordance with claim 14, wherein said second pressure is ranging from about 0.1 to 0.2 torr.

28. The method in accordance with claim 14, wherein said first gas maintains at said second pressure for a time not less than 10 minutes.

29. The method in accordance with claim 14, wherein said annealing process is accomplished at a temperature in between about 800 and 850° C.

* * * * *